(12) United States Patent
Hernandez (10) Patent No.: US 10,374,111 B1
(45) Date of Patent: Aug. 6, 2019

(54) METHOD AND SYSTEM FOR COLLECTING AND DISTRIBUTING RADIATION

(71) Applicant: Jorge S. Hernandez, Albuquerque, NM (US)

(72) Inventor: Jorge S. Hernandez, Albuquerque, NM (US)

( * ) Notice: Subject to any disclaimer, the term of this patent is extended or adjusted under 35 U.S.C. 154(b) by 0 days.

(21) Appl. No.: 15/882,453

(22) Filed: Jan. 29, 2018

Related U.S. Application Data

(60) Division of application No. 14/493,252, filed on Sep. 22, 2014, now Pat. No. 9,882,079, which is a continuation of application No. 12/843,539, filed on Jul. 26, 2010, now Pat. No. 8,839,783.

(60) Provisional application No. 61/228,446, filed on Jul. 24, 2009.

(51) Int. Cl.
| | |
|---|---|
| *F21S 11/00* | (2006.01) |
| *F21S 19/00* | (2006.01) |
| *H01L 31/0525* | (2014.01) |
| *F24S 23/00* | (2018.01) |
| *F24S 23/30* | (2018.01) |
| *F24S 23/77* | (2018.01) |
| *H02S 40/38* | (2014.01) |
| *H01L 31/054* | (2014.01) |

(52) U.S. Cl.
CPC ......... *H01L 31/0525* (2013.01); *F21S 11/00* (2013.01); *F21S 19/005* (2013.01); *F24S 23/12* (2018.05); *F24S 23/30* (2018.05); *F24S 23/77* (2018.05); *H01L 31/0543* (2014.12); *H01L 31/0547* (2014.12); *H02S 40/38* (2014.12); *Y02E 10/40* (2013.01); *Y02E 10/52* (2013.01)

(58) Field of Classification Search
CPC ......... F24J 2/08; F24J 2/00; F24J 2/38; Y02E 10/40
USPC ............... 126/605; 353/3; 136/244
See application file for complete search history.

(56) References Cited

U.S. PATENT DOCUMENTS

| | | | | |
|---|---|---|---|---|
| 4,297,000 | A * | 10/1981 | Fries | F21S 11/00 362/557 |
| 4,349,245 | A * | 9/1982 | Kliman | F21S 11/00 359/597 |
| 4,411,490 | A * | 10/1983 | Daniel | F21S 11/00 126/648 |
| 7,555,024 | B2 * | 6/2009 | Ishaaya | H01S 3/07 372/101 |
| 2015/0293432 | A1* | 10/2015 | Kimura | G03B 21/204 353/31 |

* cited by examiner

*Primary Examiner* — Gregory L Huson
*Assistant Examiner* — Nikhil P Mashruwala (57) ABSTRACT

A method and system for collecting and distributing generated and/or solar radiation. The distribution is a pulsed distribution. A pulsed distribution subsystem combining a generated radiation source with a solar radiation collector is provided. Radiation from the pulsed distribution subsystem is provided to one or more discrete distribution systems; the discrete distributions systems transmit and distribute radiation, such as visible light, to one or more end use points in a facility.

8 Claims, 4 Drawing Sheets

METHOD AND SYSTEM FOR COLLECTING AND DISTRIBUTING RADIATION

CROSS-REFERENCE TO RELATED APPLICATIONS

This application is a continuation of my co-pending U.S. patent application Ser. No. 14/493,252, filed on 22 Sep. 2014, which is a continuation of U.S. patent application Ser. No. 12/843,539, filed 26 Jul. 2010 (now U.S. Pat. No. 8,839,873), which application claimed priority to, and the benefit of, the filing of U.S. Provisional Patent Application Ser. No. 61/228,446, entitled "Apparatus and Method for Collecting and Distributing Radiation," filed on 24 Jul. 2009. The specifications of the foregoing prior applications are incorporated herein by reference.

BACKGROUND OF THE INVENTION

Field of the Invention (Technical Field)

The present invention relates to an apparatus and method for collecting, transmitting, and distributing solar radiation to the interior of structures or to exterior facilities.

Description of Related Art

Currently, there is a need for inexpensive, efficient lighting for structures and facilities, using solar energy.

Throughout the 20th century, use of the sun as a source of energy has evolved considerably. The sun was the primary source of interior lighting for buildings during the day prior to the 20th century. Eventually, however, the cost, convenience, and performance of electric lamps improved, and the sun was displaced as the primary method of lighting building interiors. When solar illumination was no longer used, a revolution in the way buildings, particularly commercial buildings, were designed occurred, making them minimally dependent on natural daylight and almost totally dependent on artificial light. As a result, artificial lighting now represents the single largest consumer of electricity in commercial buildings.

During and after the oil embargo of the 1970s, renewed interest in using solar energy emerged with advancements in systems to introduce daylight into interiors, hot water heaters, photovoltaics, and other types of lighting systems that did not use oil. Today, daylighting approaches are designed to overcome earlier shortcomings related to glare, spatial and temporal variability, difficulty of spatial control, and excessive illumination. In doing so, however, a significant portion of the available visible light is wasted by shading, attenuation, and/or diffusing the dominant portion of daylight, i.e. direct sunlight, which represents more than 80% of the light reaching the earth on a typical day. Furthermore, the remaining half of energy resident in the solar spectrum, i.e. infrared radiation between 0.7 µm and 1.8 µm, is not used by typical daylighting approaches. Additionally, typical approaches add to building heat gain, require significant architectural modifications, and are not easily reconfigured.

Previous attempts to use sunlight directly for interior lighting via Fresnel lens collectors, reflective light-pipes, and fiber-optic bundles have been plagued by significant losses in the collection and distribution system, ineffective use of non-visible solar radiation, and a lack of integration with co-located electric lighting systems required to supplement solar lighting on cloudy days and at night.

Previous attempts at illumination within structures using solar energy have used methods that typically collected the solar energy to charge batteries and to power incandescent or fluorescent lighting, which required electric utility power connection from the residence or business. Electrical power wiring needed to be run from the main utility power supply, thus creating a labor-intensive installation process. Running, burying, and connecting electric wire cable is time consuming and requires specialized and skilled labor.

The traditional trade-off between night-time illumination energy required and daytime solar energy collected has precluded using only solar energy and has forced inventors to also use main utility power with its inherent complexities of installation.

The present invention relates in general to solar energy illumination of the interiors of structures or exterior facilities such as roads or stadiums. The present invention relates more particularly to an illumination system that collects solar energy, transmits the infrared portion through a coil and transmits the visible light portion through one or more transmittal lines, including but not limited to fiber optic cables or optical tubing, first to a directional light pulse delivery system that also is able to control the intensity of the delivered light. The present invention further relates to an illumination system that transmits the visible portion of solar radiation to a discrete directional delivery system that includes delivery to either optical tubes or photovoltaic devices. The present invention further relates to an illumination system that comprises an energy storage system that provides constant illumination to any location during both the day and the night.

The present invention comprises a system to collect, transmit, direct, use, and store solar energy during daylight hours. The present invention further comprises light-emitting diodes (LEDs) that are automatically activated when solar radiation is not available, such as at night or during a cloudy day.

Novel features and further scope of applicability of the present invention will be set forth in part in the detailed description to follow, taken in conjunction with the accompanying drawings, and in part will become apparent to those skilled in the art upon examination of the following, or may be learned by practice of the invention.

SUMMARY OF EMBODIMENTS OF THE PRESENT INVENTION

The present invention is directed to a solar radiation collection and distribution method and system employing an input fiber optic cable, a lens disposed alignedly adjacent to said cable, a mirror disposed alignedly adjacent to said lens for reflecting a portion of radiation to a second nonaligned lens, wherein said second lens focuses the radiation, and a photovoltaic cell movably disposed on a track and a collector target comprising a fiber optic cable.

The solar radiation collection and distribution method and system also employ a motor that provides the power needed to move the photovoltaic cell back and forward along the track, in order to adjust the placement of the photovoltaic cell at any point along the track. The photovoltaic cell is movably disposed on the track to obstruct said collector target and alternately to provide radiation to the collector target.

The method and system further utilize a second lens disposed alignedly adjacent to the mirror and a second mirror disposed alignedly adjacent to the second lens. The mirror reflects a portion of radiation to an additional nonaligned lens, and reflects a portion on to another aligned lens. The nonaligned lens focuses and directs the radiation to a second collector target.

The method and system also use a second photovoltaic cell movably disposed on a second track. The collector target comprises a fiber optic cable that transmits the radiation to a destination, wherein the destination comprises an interior room of a structure.

The method and system further employ a generated radiation source; a rotating reflective surface directing radiation to said collector target; a high-speed motor; and a photo sensor.

The present disclosure is also directed to a method of collecting and distributing solar radiation comprising disposing a lens alignedly adjacent to an input fiber optic cable; disposing a mirror alignedly adjacent to the lens; reflecting a portion of radiation to a second nonaligned lens; focusing the radiation; moving a photovoltaic cell on a track; and blocking and unblocking a collector target. The method further comprises providing a motor for moving the photovoltaic cell and disposing a second lens alignedly adjacent to the mirror.

Additionally, there is disclosed a method of collecting and distributing solar radiation comprising: collecting solar radiation; focusing radiation into a beam onto a reflective surface; rotating the reflective surface; reflecting the beaming radiation in a circle; collecting reflected radiation with a target; and transferring the collected radiation to an end fixture.

BRIEF DESCRIPTION OF THE DRAWINGS

The accompanying drawings, which are incorporated into and form a part of the specification, illustrate one or more embodiments of the present invention and, together with the description, serve to explain the principles of the invention. The drawings are only for illustrating one or more preferred embodiments of the invention and are not to be construed as limiting the invention. In the drawings.

DETAILED DESCRIPTION OF EMBODIMENTS

Solar collection technology is currently used to generate electric potential through photovoltaic cells, to generate heat with solar water heating panels, and to distribute visible light via fiber optic cables or sky lights. The embodiments of the present invention relate to an improvement on current solar collection and distribution technology. The present invention provides for a hybrid solar radiation collection and distribution system comprising both passive solar and active solar components, generating electric potential, generating heat, and distributing visible light to numerous endpoints.

Figure 1:
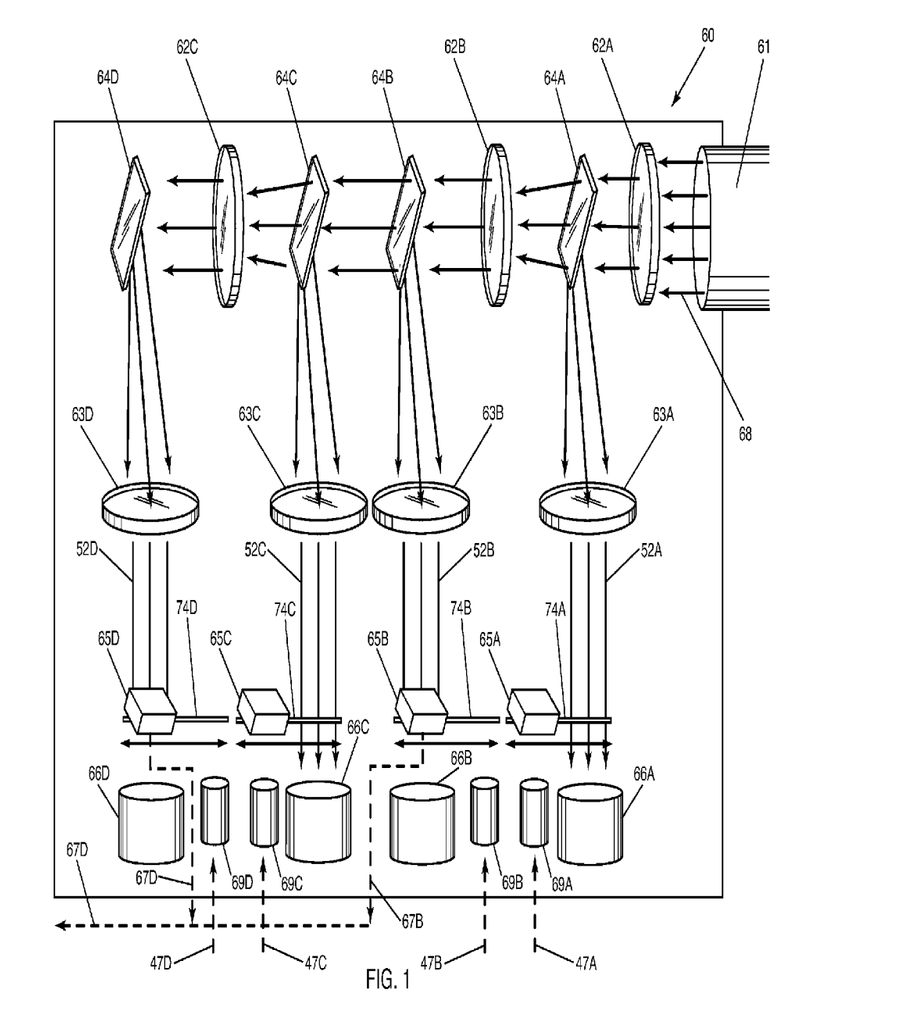
FIG. 1 is an illustration of an embodiment of the present invention comprising a discrete distribution system.

FIG. 1 is an illustration of an embodiment of the present invention comprising discrete distribution system 60, showing different configurations of the embodiment. Discrete distribution system 60 reduces the intensity of the light using reflective surfaces or filters and redistributes the light into discrete amounts which can then be used in end use devices. Another embodiment of the present invention comprises an assembly that stops the transmission of light when light is not desired at an end use fixture. The assembly that stops the transmission of light comprises a photovoltaic cell that collects the light and transmits the light to a storage cell comprising a battery.

FIG. 1 is a top view of discrete distribution system 60 comprising lenses 62A, 62B, and 62C; mirrors 64A, 64B, 64C, and 64D; lenses 63A, 63B, 63C, and 63D; and photovoltaic cells 65A, 65B, 65C, and 65D. Input fiber optic cable 61 transfers input electromagnetic radiation 68 from a solar collector. Motors, preferably high-speed motors 69A, 69B, 69C and 69D provide power to move photovoltaic devices 65A, 65B, 65C, and 65D on tracks 74A, 74B, 74C, and 74D, respectively, to obstruct optic cables or to provide access of radiation 68 to optic cables. High-speed motors 69A, 69B, 69C and 69D preferably operate at greater than 80 Hz or 3,000 rpm.

Lens 62A focuses and transfers electromagnetic radiation 68 to mirror 64A, which reflects a portion of the radiation to lens 63A and transmits a portion of the electromagnetic radiation to lens 62B. The present invention provides for the portion of radiation transferred and reflected to be varied by varying placement of the mirrors and the lens, and alternately by varying the types of lenses and mirrors. Lens 63A focuses the radiation reflected from mirror 64A and transmits it as focused radiation 52A to fiber optic cable 66A, which since it is unobstructed by photovoltaic cell 65A absorbs radiation 52A. Fiber optic cable 66A then transmits a portion of the radiation to a destination. The destination comprises a room, an outside facility, or any other structure or facility where light is desired.

Alternately, lens 62B focuses electromagnetic radiation 68 that is transmitted through lens 62A and mirror 64A onto mirror 64B, which reflects a portion of the electromagnetic radiation to lens 63B, which focuses the radiation reflected from mirror 64B and transmits it as focused radiation 52B to fiber optic cable 66B. Motor 69B which is powered by electricity flowing through circuit 47B moves photovoltaic cell 65B on track 74B. Photovoltaic cell 65B obstructs fiber optic cable 66B and thus blocks the transmittal of radiation through the fiber optic cable. Photovoltaic device 65B creates power output 67B.

Lens 62A, mirror 64A, lens 62B, mirror 64B, and mirror 64C transmit a portion of electromagnetic radiation 68 to lens 62C. Mirror 64C reflects a portion of electromagnetic radiation 68 to lens 63C which focuses and transmits reflected radiation 52C to fiber optic cable 66C. Fiber optic cable 66C is not obstructed by photovoltaic device 65C. Motor 69B, which is powered by electricity flowing through circuit 47B, moves photovoltaic cell 65B. Electricity flowing through circuit 47C powers motor 69C which moves photovoltaic cell 65C on track 74C. Fiber optic cable 66C transmits a portion of the radiation to a destination. The destination comprises a room, an outside facility, or any other structure or facility where light is desired.

Lens 62C focuses transmitted electromagnetic radiation onto mirror 64D, which reflects electromagnetic radiation 68 to lens 63D. Lens 63D focuses the previously reflected radiation and transmits radiation 52D to photovoltaic device 65D. Motor 69D which is powered by electricity flowing through circuit 47D moves photovoltaic cell 65D on track 74D. Photovoltaic cell 65D obstructs fiber optic cable 66D and thus blocks the transmittal of radiation through the fiber optic cable. Photovoltaic device 65D creates power output 67D.

The present invention comprises discrete distribution system 60 providing electromagnetic radiation input from a collector and subsequently transferring the electromagnetic radiation to a plurality of devices and locations as desired.

An alternate embodiment of the present invention comprising discrete distribution system 60 disposes the mirrors, lens, photovoltaic devices, and optic cables illustrated in FIG. 1 on a plurality of tracks. Motors translate the plurality of mirrors, lens, photovoltaic devices, and optic cables in a controlled fashion. The mirrors, lens, photovoltaic devices, and optic cables of the present invention are alternately disposed in any number of alternate desired configurations.

Another embodiment of the discrete distribution system 60 of the present invention rotates the mirrors, lens, photovoltaic devices, and optic cables about a fixed axis by motors and maximizes efficiency and output and distributes light to any desired location and at any desired intensity.

Another embodiment of the present invention comprises filters disposed adjacent to the fiber optic cables. The filters produce a plurality of colors of light at fixtures installed at desired locations.

Figure 2:
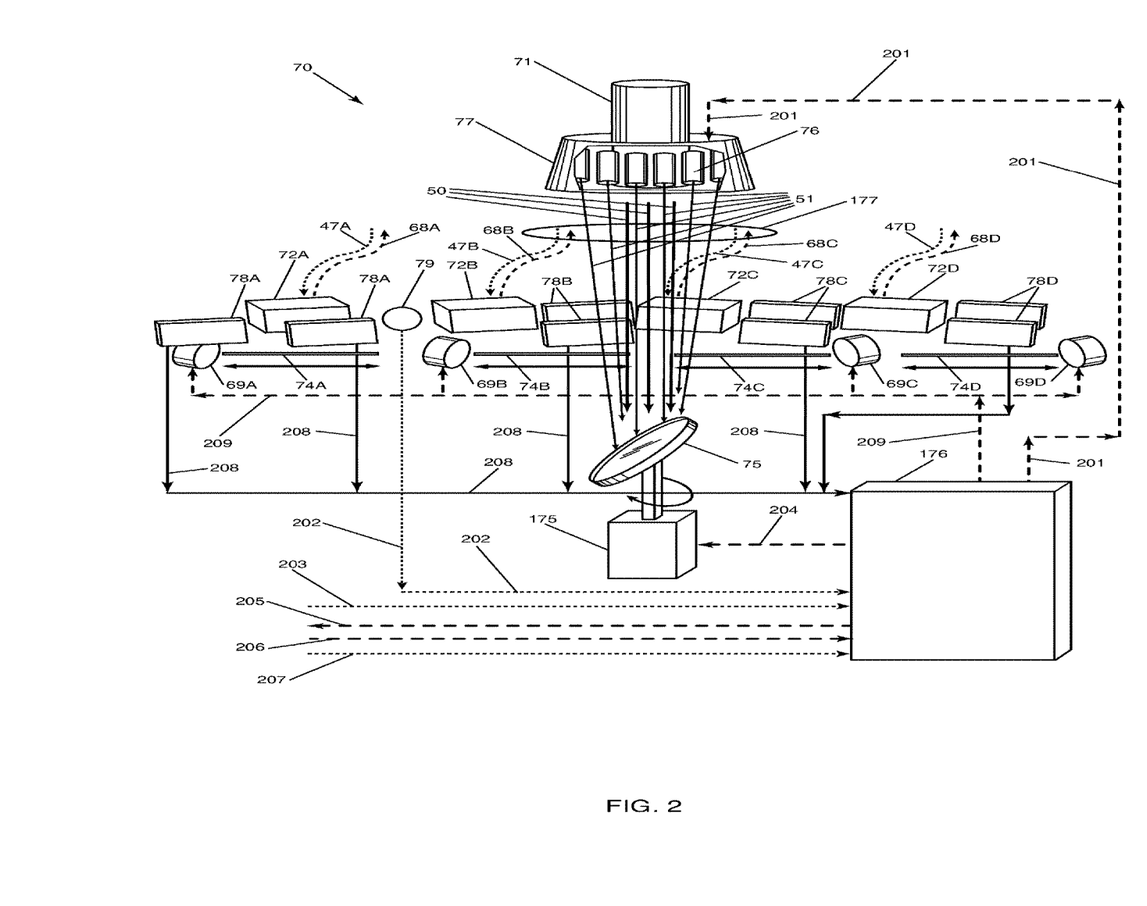
FIG. 2 illustrates an embodiment of the present invention comprising the interior of a pulsed distribution system in a horizontally aligned configuration.

FIG. 2 illustrates an embodiment of the present invention comprising the interior of pulsed distribution system 70 in a horizontally aligned configuration of the embodiment.

Pulsed distribution system 70 and discrete distribution system 60 are preferably disposed in discrete containers in a vacuum for optimum light transference efficiency.

Pulsed distribution system 70 preferably receives radiation comprising concentrated visible light from a solar collector system. The collector tracks the sun using a separate photovoltaic collector, battery pack, tracking circuit, and tracking motors. A photo sensor measures the intensity of the visible light as it is being collected at the collector surface. A control circuit that is linked to the photo sensor and to LEDs or any other type of artificial lighting source located in pulsed distribution system assembly 70 controls light generated by LEDs or any other type of artificial lighting source to supplement or replace the visible light portion of the solar radiation collected, and thus a constant light intensity is preferably maintained at the end use device, in case of cloud cover or nightfall. The concentrated light is preferably transferred using fiber optic cables or optical tubing to pulsed distribution system 70.

Pulsed distribution system 70 comprises an efficient system that delivers needed or desired light intensity to a plurality of selected locations. Solar radiation is collected and distributed through pulsed distribution system 70 that preferably comprises a controller that controls the distribution and intensity of light at one centralized point which eliminates the need for individual controls and emitters associated with multiple individual end fixtures. The emitters are available in a plurality of shapes and are replaceable. The emitters are available in a plurality of colors and hues and are comprised of materials including but not limited to optically clear plastic and silica. The emitters comprise a ceramic material or another light-diffusing media providing uniform light dispersion.

Pulsed distribution system 70 comprises lens 177 which concentrates collected radiation 50 and generated radiation 51 into a central radiation beam that is directed to lens 75. The central radiation beam is subsequently manipulated by being reflected by rotating reflective surface 75. The central radiation beam is thus directed to target outputs such as photovoltaic cells, fiber optics, or any other light transferring media. Motor 175 comprising a high revolution per minute (RPM) motor directs the central radiation beam to multiple targets at a frequency greater than can be detected by the human eye. Therefore, the central beam of radiation comprises a source of light that is distributed to a plurality of targets at a frequency sufficient for the light to appear to the naked eye to be visible in multiple places at the same time.

Pulsed distribution system assembly 70 further comprises light source 71 comprising an optic tube, a fiber optic cable, or any other light transmittal device, which transmits light from an exterior solar collector, not shown in FIG. 1, to the pulsed distribution system assembly of the present invention.

Light 76 generated by other sources such as chemical, bio-chemical, electrical, or LED alternately is input into pulsed distribution system assembly 70. Lens 177 concentrates the transmitted or generated light into a central radiation beam. The beam is manipulated by movement of the sources of the transmitted or generated light and subsequently creates a pulse that impinges on at least one optic tube or photovoltaic cell. The beam is also manipulated indirectly using a reflective surface such as a mirror or alternately by ionizing the light beam and controlling it by an electromagnetic field.

Input fiber optic cable 71 is disposed connectedly to generated light housing 77. LED assembly 76 is disposed in generated light housing 77. Radiation 50 collected from fiber optic cable 71 along with generated radiation 51 from LED assembly 76 is routed through and focused by lens 177.

Reflective surface 75 rotates by being powered by motor 175. Reflective surface 75 reflects and directs radiation to fiber optic cable input collector or target 72A. The radiation collected by target 72A is transmitted to an end location, apparatus, or facility.

Targets 72A, 72B, 72C, and 72D comprising fiber optic cables or optical tubing collectors transfer light focused into a beam to an end use apparatus. The end use apparatus comprises a light emitter, a light tube, or discrete distribution system 60 illustrated in FIG. 1. The discrete distribution system described previously, similar to the pulsed distribution system, comprises target photovoltaic cells that are moved mechanically into the path of the radiation and generate electricity when light at an end destination is not needed.

Motor 175 continues to rotate reflective surface 75 and reflects radiation to photo sensor 79 next after target 72A. Photo sensor 79 verifies the intensity of the radiation reflected from reflective surface 75. Photo sensor signal current 202 flows from photo sensor 79 to a light intensity circuit disposed in controller 176, thus sending a signal to controller 176. Controller 176 then varies the generated light 51 by controlling emitters 76 through circuit 201. At this time fiber optic cable targets 72B, 72C, and 72D and photovoltaic devices 78A, 78B, 78C, and 78D are not yet exposed to radiation reflected from reflective surface 75 because it has not rotated far enough.

Next, high-speed motor 175 further rotates reflective surface 75. The radiation beam is directed to plurality of target outputs comprising photo-voltaic cells, fiber optics, or other light transferring media. The targets receive the radiation beam in pulses, resulting from the high-speed motor rotating the reflective surface 75 and thus rotating the reflected radiation. The radiation pulses at a frequency faster than the naked eye can distinguish due to the high-speed motor's capability to rotate the reflective surface at a very high rate of speed. Therefore, the source light, both transmitted and generated, is distributed to multiple targets in sequence at a frequency so great that the visible light appears, to a human eye, to be located at more than one target at the same time. The light intensity remains constant.

Generated DC current 201 emanating from controller 176 powers generated light source comprising LED assembly 76. A communication signal from photo sensor signal current 202 verifies light intensity. Communication signal from current 203 generated from a photo sensor verifies light intensity to controller 176.

The central radiation beam generates an electric current by placing a photovoltaic cell 78A in the path of the reflected radiation. Motor 69A moves cell 78A along track 74A. Current 208 is created by photovoltaic cells 78A, 78B, 78C and 78D and current 208 provides power to controller 176. The electric potential is stored in batteries for later use or used immediately, providing power for beam manipulation, light generation, or returned to the grid via a converter.

Photovoltaic cells 78A, 78B, 78C and 78D when disposed in the path of the reflected radiation provide additional electric current when the end use device is not in use. Switch circuits 47A, 47B, 47C and 47D turn off the current to the end use devices. Photovoltaic cells 78A, 78B, 78C and 78D when moving obstruct optic cable collector targets 72A, 72B, 72C, and 72D completely and thus turn off the end use devices. Alternately Photovoltaic cells 78A, 78B, 78C and 78D are disposed in various positions and incompletely obstruct targets and provide reduced light transmittal to end use devices. A dimming effect is created.

Motor control circuit comprising electric current 204 from controller 17 powers motor 175. Motor control circuit comprising electric current 209 powers motors 69A, 69B, 69C, and 69D. Photovoltaic cell power input comprising electric current 206 flows from photocells 65A, 65B, 65C, and 65D disposed in discrete distribution system 60 as illustrated in FIG. 1. Communications circuit comprising signal 207 communicates between discrete distribution system 60 and controller 176.

Figure 4:
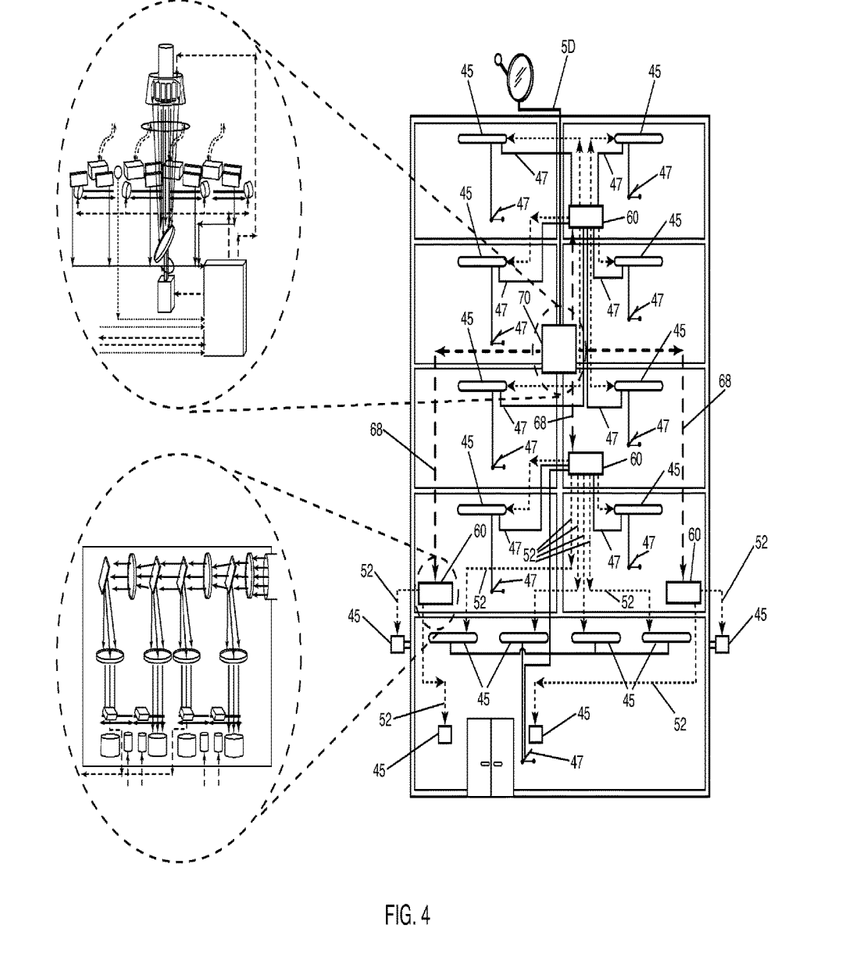
FIG. 4 is an illustration of a large multi-story building comprising multiple rooms illuminated by an embodiment of the present invention.

As reflective surface 75 continues to rotate, light is next reflected to fiber optic cable collector target 72B. The light transferred via output fiber optic or optical tubing 68B is then diffused using light emitting end use devices 45, as illustrated in FIG. 4. The light emitting end use devices are made of light diffusing material such as plastic, ceramic, glass, or any other suitable material, and are made in a shape configuration similar to off-the-shelf light bulbs, light tubes, or other lighting device.

As reflective surface 75 continues to rotate, light is next reflected to photovoltaic cell 78B which creates a current in circuit 208 when light switch 47B is switched off. Motor 69B moves photovoltaic cell 78B mechanically along track 74B into the path of the reflected radiation beam to provide additional electric current to control controller 176 when an end use device is turned off.

As reflective surface 75 continues to rotate, light is next reflected to fiber optic cable collector target 72C. The light transferred via output fiber optic or optical tubing 68C is then diffused using light emitting end use devices 45 as illustrated in FIG. 4.

As reflective surface 75 continues to rotate, light is next reflected to photovoltaic cell 78C which creates current in circuit 208 when light switch 47C is switch off. Motor 69C moves photovoltaic cell 78C mechanically along track 74C into the path of the beam to provide more electric current when an end use device is turned off.

As reflective surface 75 continues to rotate, light is next reflected to fiber optic cable collector target 72D. The light transferred via output fiber optic or optical tubing 68D is then diffused using the light emitting end use devices 45, as illustrated in FIG. 4. As reflective surface 75 continues to rotate, light is next reflected to photovoltaic cell 78D which creates current in circuit 208 when light switch 47D is switched off. Motor 69D moves photovoltaic cell 78D mechanically along track 74D to provide more electric current when an end use device is turned off.

As reflective surface 75 continues to rotate, and rotates a complete 360 degrees, light is reflected back to photo cell 78A restarting the cycle described previously.

All mirrors, lens, photovoltaic devices, and optic cables in FIG. 2 disposed within pulsed distribution system 70 alternately are disposed on tracks and translated in a controlled fashion by motors; alternately are disposed in alternate desired configurations; and alternately are rotated about a fixed axis by motors in order to maximize efficiency and output and to distribute light to any desired location and at any desired intensity. In another embodiment of the present invention, filters control the color of light at end fixtures by being disposed adjacent to the fixtures.

Figure 3:
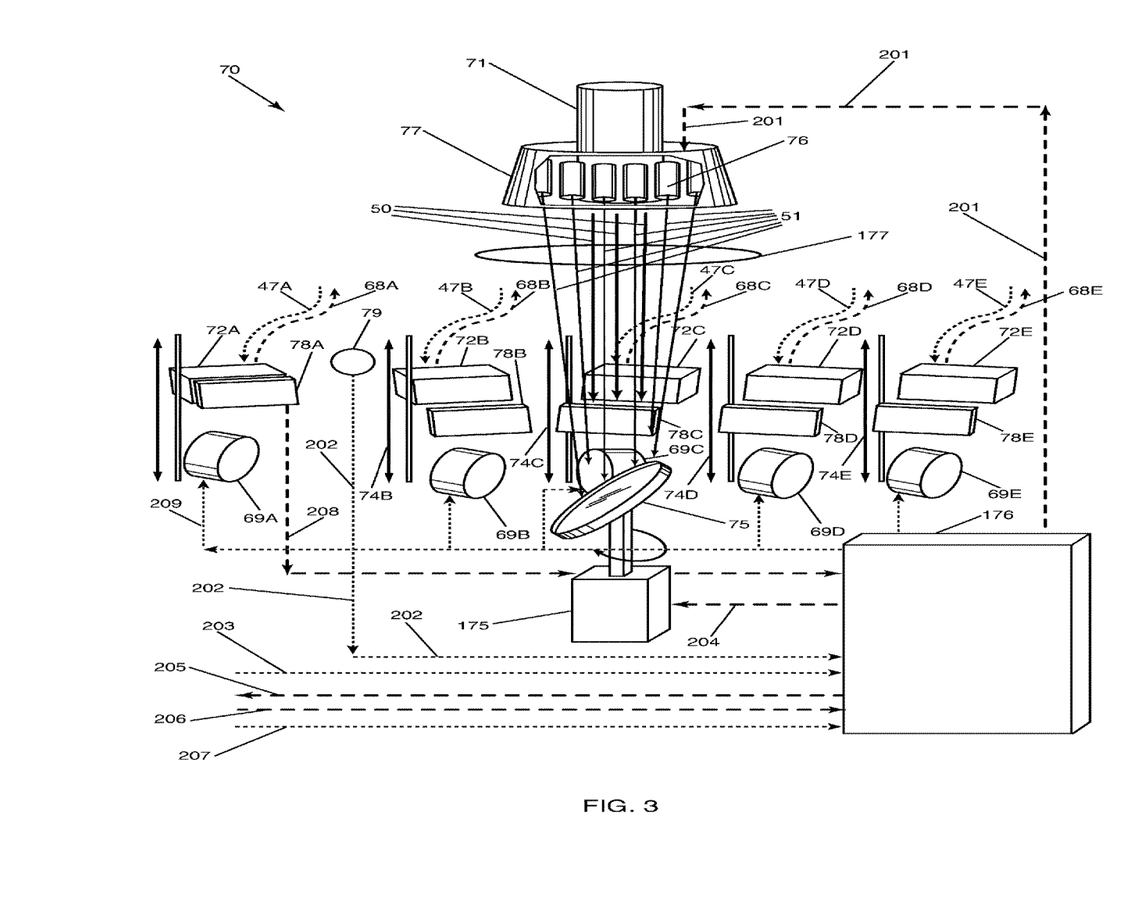
FIG. 3 illustrates an embodiment of the present invention comprising the interior of pulsed distribution system disposed in a vertically aligned configuration.

FIG. 3 illustrates a configuration of the embodiment illustrated in FIG. 2 wherein tracks are disposed vertically, so photovoltaic cells are moved in a direction at an angle of 90 degrees to the movement of the photovoltaic cells on tracks illustrated in FIG. 2. The vertical track embodiment provides for an additional number of fiber optic collectors, thus providing more light to emitters. This embodiment provides for installation in large structures or buildings. However, no power is generated unless the lights in the building are turned off.

FIG. 3 illustrates a light distribution assembly comprising input fiber optic cable 71 disposed connectedly to LED housing 77, which contains LED assembly 76. Radiation 50 from fiber optic cable 71 and radiation 51 from LED assembly 76 is routed through and focused by lens 177.

Pulsed light distribution assembly 70 further comprises reflective surface 75 which rotates and is powered by motor 175. Reflective surface 75 reflects and directs radiation to fiber optic cable input collector or target 72A. The radiation collected by target 72A is transmitted to an end location, apparatus, or facility.

Targets 72A, 72B, 72C, 72D, and 72E comprising fiber optic or optical tubing collectors transfer light from pulsed distribution system 70 focused into a beam to an end use apparatus. The end use apparatus comprises a light emitter, light tube, or discrete distribution system 60 illustrated in FIG. 1. An embodiment of the present invention reduces the intensity of the light using reflective surfaces or filters. An embodiment of the present invention redistributes the light into discrete amounts which are used in end use devices and fixtures, such a room lights. Discrete distribution system 60, similar to pulsed distribution system 70, comprises target photovoltaic cells movably disposed in the path of the reflected radiation beam to generate electricity when light is not needed at the end facility.

Motor 175 continues to rotate reflective surface 75 and reflects radiation to photo sensor 79, which verifies the intensity of the radiation. Photo sensor signal current 202 flows from photo sensor 79 to a light intensity circuit disposed in controller 176, thus sending a signal to controller 176. At this time, fiber optic cables 72B, 72C, 72D, and 72E and photovoltaic devices 78A, 78B, 78C, 78D, and 78E are not yet exposed to radiation reflected from reflective surface 75 because reflective surface 75 has not yet rotated sufficiently.

Next, high-speed motor 175 further rotates reflective surface 75. The radiation beam is directed to plurality of target outputs comprising photo-voltaic cells, fiber optics, or other light transferring media. The targets receive the radiation beam in pulses, resulting from the high-speed motor rotating the reflective surface 75 and thus rotating the reflected radiation. The radiation pulses at a frequency faster than the naked eye can distinguish due to the high-speed motor's capability to rotate the reflective surface at a very high rate of speed. Therefore, the source light, both transmitted and generated, is distributed to multiple targets in sequence at a frequency so great that the visible light appears, to a human eye, to be located at more than one target at the same time. The light intensity remains constant.

Generated DC current 201 emanating from controller 176 powers generated light source comprising LED assembly 76. A communication signal from photo sensor signal current 202 verifies light intensity. Communication signal from current 203 generated from a photo sensor verifies light intensity to controller 176.

The central radiation beam generates an electric current by placing a photovoltaic cell 78A in the path of the reflected radiation. Motor 69A moves cell 78A along track 74A. Current 208 is created by photovoltaic cells 78A, 78B, 78C, 78D, and 78E and current 208 provides power to controller 176. The electric potential is stored in batteries for later use or used immediately, providing power for beam manipulation, light generation, or returned to the grid via a converter.

Photovoltaic cells 78A, 78B, 78C and 78D when disposed in the path of the reflected radiation provide additional electric current when the end use device is not in use. Switch circuits 47A, 47B, 47C and 47D turn off the current to the end use devices. Photovoltaic cells 78A, 78B, 78C and 78D when moving obstruct optic cable collector targets 72A, 72B, 72C, and 72D completely and thus turn off the end use devices. Alternately Photovoltaic cells 78A, 78B, 78C and 78D are disposed in various positions and incompletely obstruct targets and provide reduced light transmittal to end use devices. A dimming effect is created.

Motor control circuit comprising electric current 204 from controller 176 powers motor 175. Motor control circuit comprising electric current 209 powers motors 69A, 69B, 69C, and 69D. Photovoltaic cell power input comprising electric current 206 flows from photocells 65A, 65B, 65C, and 65D disposed in discrete distribution system 60 as illustrated in FIG. 1. Communications circuit comprising signal 207 communicates between discrete distribution system 60 and controller 176.

As reflective surface 75 continues to rotate, light is next reflected to photo sensor 79 which measures the intensity of the light beam. Communication circuit 202 sends a signal to controller 176. Controller 176 then can vary the generated light 51 by controlling emitters 76 through circuit 201.

As reflective surface 75 continues to rotate, light is next reflected to fiber optic cable collector target 72B. The light transferred via output conduit comprising fiber optic or optical tubing 68B is then diffused using light emitting end use devices 45, as illustrated in FIG. 4. The light emitting end use devices are made of light diffusing material such as plastic, ceramic, glass, or any other suitable material, and are made in a shape configuration similar to off-the-shelf light bulbs, light tubes, or other lighting device.

Motor 69B moves photovoltaic cell 78B along track 74B into the path of the reflected radiation beam to provide additional electric current when an end use device is turned off.

As reflective surface 75 continues to rotate, light is next reflected to fiber optic cable collector target 72C. The light transferred via output conduit comprising fiber optic or optical tubing 68C is then diffused using the light emitting end use devices 45 as illustrated in FIG. 4.

Motor 69C moves photovoltaic cell 78C along track 74C into the path of the reflected radiation beam to provide additional electric current when an end use device is turned off.

As reflective surface 75 continues to rotate, light is next reflected to fiber optic cable collector target 72D. The light transferred via output conduit comprising fiber optic or optical tubing 68D is then diffused using the light emitting end use devices 45, as illustrated in FIG. 4. As reflective surface 75 continues to rotate, light is next reflected to photovoltaic cell 78D which creates current in circuit 208 when light switch 47D is switched off. Motor 69D moves photovoltaic cell 78D mechanically along track 74D to provide more electric current when an end use device is turned off.

As reflective surface 75 continues to rotate, light is next reflected to fiber optic cable collector target 72E. The light transferred via output conduit comprising fiber optic or optical tubing 68E is then diffused using the light emitting end use devices 45 as illustrated in FIG. 4. Motor 69E moves photovoltaic cell 78E along track 74E into the path of the reflected radiation beam to provide additional electric current when an end use device is turned off.

As reflective surface 75 continues to rotate a full 360 degrees, light is reflected back to photo cell 78A restarting the cycle.

Pulsed distribution system 70 comprises an artificially-generated light assembly, a transmitted light (both artificially-generated and collected solar radiation) assembly, an assembly that monitors the intensity of both artificially-generated light and collected solar radiation, an assembly for controlling artificially-generated light, and a power-generating assembly. Collected solar radiation data is constantly monitored by sensors. The data is preferably communicated to a control system that allows for artificially-generated light to supplement the collected solar radiation if needed, in order to ensure that the totality of light that is transmitted to an end use fixture remains constant in intensity over a desired time period.

All mirrors, lens, photovoltaic devices, and optic cables in FIG. 3 disposed in within pulsed distribution system 70 may be disposed on tracks and translated in a controlled fashion by motors; may be disposed in alternate desired configurations; and may be rotated about a fixed axis by motors in order to maximize efficiency and output and to distribute light to any desired location and at any desired intensity. Filters may be used to control the color of light at end fixtures.

FIG. 4 is an illustration of a large multi-story building with multiple rooms illuminated by both pulsed distribution system 70 and the discrete distribution system 60 embodiments of the present invention. Multiple discrete distribution systems 60 and pulsed distribution systems 70 provide illumination to all interior rooms via end fixtures 45.

Although the invention has been described in detail with particular reference to these preferred embodiments, other embodiments can achieve the same results. Variations and modifications of the present invention will be obvious to those skilled in the art and it is intended to cover all such modifications and equivalents. The entire disclosures of all references, applications, patents, and publications cited above and/or in the attachments, and of the corresponding application(s), are hereby incorporated herein by reference.

I claim:

1. A method of collecting and distributing solar radiation comprising:
   providing a pulsed distribution system by:
      collecting solar radiation;
      generating radiation;
      focusing the solar radiation and the generated radiation into a central radiation beam onto a reflective surface;
      reflecting the central radiation beam from the reflective surface;
      rotating the reflective surface through 360 degrees to distribute the central radiation beam sequentially to each of a plurality of input targets comprising fiber optic cables;
      collecting the reflected central radiation beam with the plurality of input targets;
      adjustably moving photovoltaic cells between an unobstructing position, and an obstructing position between the reflective surface and each of the input targets respectively, and any point between the unobstructing position and the obstructing position; and
      wherein when a one of the photovoltaic cells is in the unobstructing position, the radiation beam is transmitted to a respective one of the input targets, and when in the obstructing position the one of the photovoltaic cells blocks the transmittal of the radiation beam to the respective one of the input targets; and
      transferring via the fiber optic cables the collected radiation to at least one end use apparatus.

2. The method of claim 1 wherein transferring the collected radiation to at least one end use apparatus further comprises providing an end use fixture wherein a color of light is controlled with a filter.

3. The method of claim 1 wherein transferring the collected radiation to at least one end use apparatus comprises:
   transferring collected radiation to a discrete distribution system by:
      disposing a first primary lens adjacent to an input fiber optic cable, the lens focusing incoming radiation from the input fiber optic cable;
      disposing a first mirror adjacent to the first primary lens;
      operating the first mirror to reflect a portion of radiation to a first secondary lens positioned obliquely or perpendicularly to the first mirror;
      focusing, with the first secondary lens, the portion of radiation toward a first collector target comprising a fiber optic cable; and
      adjustably moving a first photovoltaic cell between an unobstructing position, and an obstructing position between the first secondary lens and the first collector target, and any point between the unobstructing position and the obstructing position;
   wherein when the photovoltaic cell is in the unobstructing position, the focused portion of the radiation is transmitted to the first collector target, and when in the obstructing position the photovoltaic cell blocks the transmittal of the focused portion of the radiation to the first collector target.

4. The method of claim 3 further comprising:
   disposing a second primary lens aligned with the first primary lens and adjacent to the first mirror;
   disposing a second mirror, adjacent to the second primary lens, for reflecting a second portion of the incoming radiation to a second secondary lens positioned obliquely or perpendicularly to the second primary lens; and
   focusing, with the second secondary lens, the second portion of radiation to a second collector target.

5. The system of claim 4 further comprising:
   adjustably moving a second photovoltaic cell between a second unobstructing position, and a second obstructing position between the second secondary lens and the second collector target, and any point between the second unobstructing position and the second obstructing position; and
   wherein when the second photovoltaic cell is in the second unobstructing position, the second portion of radiation is transmitted to the second collector target, and wherein when in the second obstructing position said second photovoltaic cell blocks transmittal of the second portion of radiation to the second collector target.

6. The method of claim 5 further comprising moving by motors the photovoltaic cells.

7. A method of collecting and distributing solar radiation comprising:
   providing a pulsed distribution system by:
      collecting solar radiation;
      generating radiation;
      focusing the solar radiation and the generated radiation into a central radiation beam onto a reflective surface;
      reflecting the central radiation beam from the reflective surface;
      rotating the reflective surface through 360 degrees to distribute the central radiation beam sequentially to each of a plurality of input targets comprising fiber optic cables;
      collecting the reflected central radiation beam with the plurality of input targets;
   adjustably moving photovoltaic cells between an unobstructing position, and an obstructing position between the reflective surface and each of the input targets respectively, and any point between the unobstructing position and the obstructing position.

8. The method claim 7 wherein when a one of the photovoltaic cells is in the unobstructing position, the radiation beam is transmitted to a respective one of the input targets, and when in the obstructing position the one of the photovoltaic cells blocks the transmittal of the radiation beam to the respective one of the input targets; and further comprising transferring via the fiber optic cables the collected radiation to at least one end use apparatus.

* * * * *